United States Patent [19]
Bettcher et al.

[11] Patent Number: 6,128,830
[45] Date of Patent: Oct. 10, 2000

[54] APPARATUS AND METHOD FOR DRYING SOLID ARTICLES

[75] Inventors: Dean Bettcher, 1447 McDaniel Ave., San Jose, Santa Clara County, Calif. 95126-2009; Christopher Kubinski, 925 Franquette Ave., San Jose, Santa Clara County, Calif. 95125-2620

[73] Assignees: Dean Bettcher; Christopher Kubinski

[21] Appl. No.: 09/312,075

[22] Filed: May 15, 1999

[51] Int. Cl.$^7$ .................................................. F26B 5/04
[52] U.S. Cl. .................................. 34/404; 34/409; 34/74; 34/77; 134/2
[58] Field of Search .................................... 34/72, 73, 74, 34/75, 76, 77, 79, 402, 404, 409, 418; 134/2, 6, 26

[56] References Cited

U.S. PATENT DOCUMENTS

| | | | |
|---|---|---|---|
| 3,710,450 | 1/1973 | Figiel | 34/9 |
| 5,123,176 | 6/1992 | Yamada et al. | 34/74 X |
| 5,168,369 | 12/1992 | Hebels | 34/74 X |
| 5,357,771 | 10/1994 | Schaal | 34/77 X |
| 5,367,787 | 11/1994 | Ikeda et al. | 34/77 X |
| 5,369,891 | 12/1994 | Kamikawa | 34/77 X |
| 5,551,165 | 9/1996 | Turner et al. | 34/404 |
| 5,855,077 | 1/1999 | Nam | 34/409 |
| 5,950,328 | 9/1999 | Ichiko et al. | 34/74 X |
| 5,974,689 | 11/1999 | Ferrell et al. | 34/401 X |
| 5,985,041 | 11/1999 | Florez | 34/77 X |

Primary Examiner—Stephen Gravini
Attorney, Agent, or Firm—Douglas A. Chaikin; Peninsula IP Group

[57] ABSTRACT

Disclosed herein is an apparatus and method for drying solid articles such as semiconductor wafers. In one embodiment, the dryer comprises a process tank and a drying fluid supply system. The process tank includes a plurality spray nozzles to spray a non-flammable drying fluid to wet surfaces of the article for drying without the necessity of heat or other external means. The drying fluid comprises a non-flammable, environmentally compatible, and a non-hazardous fluid including a drying agent of (hydrofluoroether) HFE and a surfactant of isopropyl alcohol (IPA). Even without the benefit of heating, little if any solution or static charge remains after drying. The drying apparatus includes a drying fluid supply system for providing the drying fluid to the plurality of spray nozzles.

25 Claims, 2 Drawing Sheets

APPARATUS AND METHOD FOR DRYING SOLID ARTICLES

BACKGROUND OF THE INVENTION

1. Field of the Invention

The present invention relates to an apparatus and methods for drying solid articles and; more particularly, the present invention relates to the field of drying solid articles such as semi-conductor articles, i.e. wafers and more particularly, to a method of spray drying which includes a drying agent in combination with one or more other chemical agents.

2. Background

In the manufacture of computer components it often required that such components such as thin film components, computer peripherals, read-write heads and semiconductor wafers are free of contaminants and aqueous residues. For example, in semiconductor wafer processing, the wafers often exit various processing stages where water or aqueous residues are present on the wafer. It is undesirable to allow the aqueous solutions to flash dry so as to leave residuals and/or stains on such articles at the end of the drying process. Such residuals on semi-conductor wafers and like solid articles create contaminants that negatively impacts yields of usage in semi-conductors and like solid articles. The residue stains and/or contaminants degrade the performance of such articles and/or interfere with a subsequent processing step.

Various known processes have been developed in an attempt to dry the wafers and similar solid articles in a manner that removes the aqueous residue, and stains, and contaminants and static without damaging or adding contaminates to the wafer or similar solid articles. One such example of a known drying process incorporates external forces in a Spin Rinse Dryer technique, SRD. SRDs use centrifugal force to cause the aqueous residue and contaminant molecules to spin off; not altogether that different from a domestic dryer unit. SRDs are inherent residual particle generators below $0.3\mu$. The residual particulate matter is formed from the mechanics of the system and the vibration between the wafers and the boat carrier.

As the wafer and the boat carrier spin, it causes the build up of static electricity. As the surface of the article changes from a wetted state to a dry state, it becomes statically charged. The change in states attracts more airborne particulates and consequently more contamination. The performance of the article is thereby further degraded. The production yield of usable articles will further decrease because of Tribol charging on the article as the result of the article being statically charged.

Increasingly there is a decreasing dimension of line widths and structure geometries on wafers. Particulate contamination is critical to fine geometries in the sub-$0.3\mu$ area. It has been noted that SRD systems have substantial difficulty cleaning particulates below $0.3\mu$. Accordingly, such SRD systems are no longer an acceptable solution to the drying needs of the semi-conductor or similar industries that require fine geometries.

Another external force dryer is known as an air knife dryer. This dryer includes a plane of forced air upon the exit of the process of the article. The forced air drying, like the spin dry technique is effective but not for the smaller particles. For particulates of less than $0.5\mu$, forced air drying will be ineffective. Similar to the SRD drying technique, the air knife leaves a trail of airborne particulates and statically charged particles, which promote the accumulation of contamination on the article to be dried.

Another category of dryer for such solid articles is the liquid solubilization, also known as a vapor drying process. Generally vapor dryers utilize an open vat of boiling alcohol or isopropyl alcohol (IPA) within a chamber. Alcohol vapor forms in the chamber above the boiling alcohol vat. The temperature of the vapor is approximately the same temperature as the alcohol in the vat. An article at ambient temperature, such as a wafer, is introduced into the chamber. Since the wafer is cooler than the vapor temperature, the alcohol vapor condenses on the wafer and creates a flushing action, which acts to remove aqueous residues and contaminants from the surface of the wafer. The condensed alcohol and residues are then collected and recirculated. Eventually, however, the temperature of the wafer begins to approach that of the alcohol vapor. When this occurs, the condensation and flushing action slows until very little aqueous residue or contaminants are removed. Thus, the efficiency of the process is evaluated by the amount of alcohol that can condense on the wafer prior to the wafer coming to vapor temperature. Additionally, if the wafer is has very little thermal mass, it is possible for the aqueous residue and contaminants to quickly evaporate (flash dry) on the wafer due to the heat in the chamber and have very little removed by any formed condensation. Thus, a limitation of this technique is the ability to condense alcohol on the wafer to produce a flushing action and yet not remove any residues or contaminants on the wafer.

The use of vapor drying processes also present several other considerations. The systems generally use large amounts of IPA, a flammable agent, a boiling sump, or vat, and coiling coils to assist in condensing the vapors on the wafer. The use of the open alcohol vat utilizes a large amount of fluid due to evaporation of the alcohol over the large surface of the vat. The separation of the aqueous residues from the alcohol is generally accomplished by distillation of the alcohol from the water through an alcohol reprocessor. These reprocessors are generally located in the same processing area and present issues of safety due to the highly flammable nature of the agents. Also, vapor emissions must be removed from the facility. Often this is accomplished using a burn box (scrubber) on the building, which burns off the emissions. The use of a burn box or scrubber also presents a high safety risk.

As noted above, the vapor drying processes present serious safety and environmental concerns. Even under the best of circumstances where there are no accidents, the costs of insurance will be quite high and add to the costs of manufacture.

Environmental and safety concerns are clearly quite high with a pot of boiling alcohol. Additionally, IPA is regulated as volatile organic compound by the EPA. VOC are considered to deplete ozone layer and create green house gas. In other words, IPA is regulated as VOC like freon and other hazardous chemicals.

Thus, despite IPA's superior cleaning properties, there are quite serious safety, environmental and financial concerns. Considering the risks make it desirable to seek other more attractive alternatives.

Another drying process is known as the Capillary Induced Removal (CIR) process. An example of this process is the Marangoni drying process. The Marangoni process removes aqueous residues using surface tension properties. In this process, an article is placed in a vat of water. A very thin layer of IPA is applied on top of the water. The difference in surface tension between the IPA and water creates a reverse meniscus on the article. When the article is slowly removed from the vat, the alcohol acts as a forcing function to drive the aqueous residue off the part. This procedure is limited in that the article must be removed from the vat very slowly so that surface tension is not broken. If the article is pulled out too quickly, the surface tension breaks and water ends up on the article and the article is contaminated. The process works best on planar geometries and requires a slow removal time. Thus, this procedure is not efficient for drying wafers and other articles with complex geometries, or non-planar geometries or where high-throughput of wafers is required.

Displacement drying is yet another process for drying wafer and other solid articles. In this process, water is displaced with volatile methyl siloxane, VMS and the article subsequently. The VMS leaves a film on the article and that film must be removed before the manufacturing process is complete or the article finished. In order to remove the residue from the displacement, a surfactant is used. In this case, VMS acts as a surfactant. Clearly having two steps is a serious disadvantage of the displacement drying process. Additionally, many VMS chemicals are flammable and present safety and environmental hazards as well. The additional step of rinsing off the film cuts down yield and adds consequently to the costs of manufacture. Additional costs include the environmental and safety costs, again adding to manufacturing costs.

What is needed is an apparatus and process which dries articles quickly and thoroughly and adds to the production yield over presently known methods, rather than decrease production yields. Additionally, such apparatus and method must pose the smallest possible risk to the environment and to the safety of all involved in the manufacturing process. What is also a needed such an apparatus and process that eliminates even ultra small particulates from the surface of the article without generating charged particles.

SUMMARY OF THE INVENTION

It is an object of this invention to provide a novel drying apparatus, which dries solid articles using an environmentally sound, and worker friendly method and products.

It is an additional object of this invention to provide a compound for use in such a drying apparatus which provides environmentally sound and worker friendly condition while increasing net yields of manufacture of the article and while drying articles more thoroughly and more cost effective than presently known methods.

It is an additional object of this invention to provide a novel method of drying solid articles, which can be used to produce greater yields with less statically charged particulates and flammability considerations.

In accordance with the above objects and those that will be mentioned and will become apparent below, the drying apparatus in accordance with this invention comprises:

a process tank having a spray member;

a platform member for holding an article to be dried in the tank;

a spray member for applying, by spraying, a drying fluid including a drying agent in combination with a surfactant to the article to be dried; the drying agent comprising HFE and the surfactant including an alcohol based product; and a drying fluid supply system connected to the spray member for supplying drying fluid to the spray member, whereby article is dried by spraying of a drying agent in combination with a surfactant.

In one exemplary embodiment in accordance with this invention, the drying fluid comprises a non-flammable mixture of a drying agent, namely, hydrofluoroether (HFE) and a surfactant, namely, isopropyl alcohol (IPA). In specific embodiments the mixture may include between 0.01% and 15% IPA and the remainder HFE. Depending upon the quantity (mass) of the articles to be dried the IPA can increased or decreased to prevent the drying fluid from becoming flammable.

A spiking system is added to the drying apparatus in another exemplary embodiment. The spiking system includes, both the ability to spike the drying agent and to spike the surfactant into the drying fluid. In this embodiment, the apparatus includes a spray system having a reservoir of drying fluid being connected to the spray members. Also connected to the reservoir are two canisters, one of drying agent, and one of surfactant. At the appropriate time more drying agent or surfactant may be added to drying fluid mixture from the one of the respective canisters, this process is known as spiking.

In any of the above exemplary embodiments, the spray system may include in other exemplary embodiment, a connection line between the reservoir and the spray member and an in-line heating unit between. Using this embodiment, the drying fluid may be heated to the desired temperature. Increases in temperature of the drying may be used to aid thorough drying of the solid articles.

In yet another exemplary embodiment of the drying apparatus and method in accordance with this invention, drying fluid is collected after spraying the article to be dried. After, collection the drying fluid is removed from the process tank and passed through a separation filter and stored in a separation tank. The difference in density between the HFE and the IPA and their insolubility with one another causes the HFE to sink to the bottom of separation tank upon filtration. The used HFE is pumped through a series of filters and at the appropriate time, pumped back into the reservoir for recycling. The HFE filters are cartridge filters that are rated $0.1\mu$ and $0.05\mu$. The second filtering finer particles than the first filter.

In another exemplary embodiment, the process tank includes at least one panel heater. The panel heater causes the ambient environment around the articles to be dried to be increased. This has the effect of increasing the thoroughness of drying.

In another exemplary embodiment, the drying apparatus and method in accordance with this invention includes a condensation prevention system. The condensation prevention system includes a series of coils either within or closely adjacent to the process tank wherein the article passes through the coils upon being removed from the platform and before being exposed completely to the ambient environment. The coils are filled preferably with water or other liquid, which can be easily keep cool for cooling of the coils. The coils are brought to the desired temperature and then upon drying the article is removed from the process tank and passed through the coils, cooled and condensation is thus prevented.

It is an advantage of this invention to a provide a method of drying an article such that the article is thoroughly dried using a one step process.

It is an additional advantage of this invention to a provide a method of drying an article such that the article is thoroughly dried using a one step process using a method and compound that are environmentally and worker friendly.

It is an additional advantage of this invention to a provide a method of drying an article such that the article is thoroughly dried using a one step process, using a method and a compound that are environmentally and worker friendly, while at the same time increasing the yields of manufacturing such articles over presently known methods.

It is an additional advantage of this invention to a provide an apparatus and method of drying an article such that the article is thoroughly dried using a one step process using a method and a compound that are environmentally and worker friendly, while at the same time providing an apparatus which relatively inexpensive, easy to maintain and increases yields over presently known methods and apparatus.

BRIEF DESCRIPTION OF THE DRAWING

For a further understanding of the objects and advantages of the present invention, reference should be made to the following detailed description, taken in conjunction with the accompanying drawing, in which like parts are given like reference numerals and wherein.

DETAILED DESCRIPTION OF THE INVENTION

Figure 1:
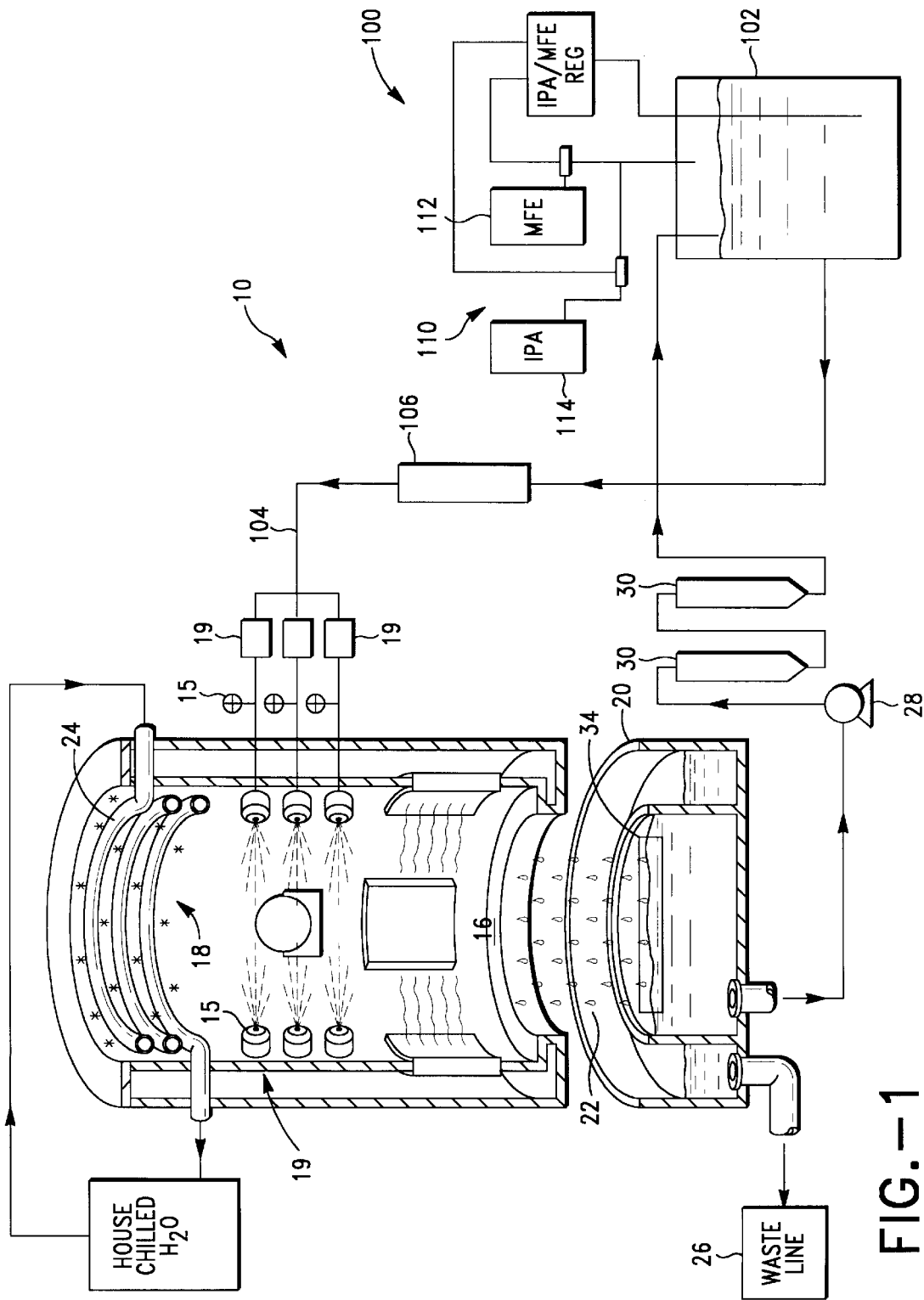
FIG. 1 is a schematic representation of the apparatus and method of drying articles in accordance with this invention.
Figure 2:
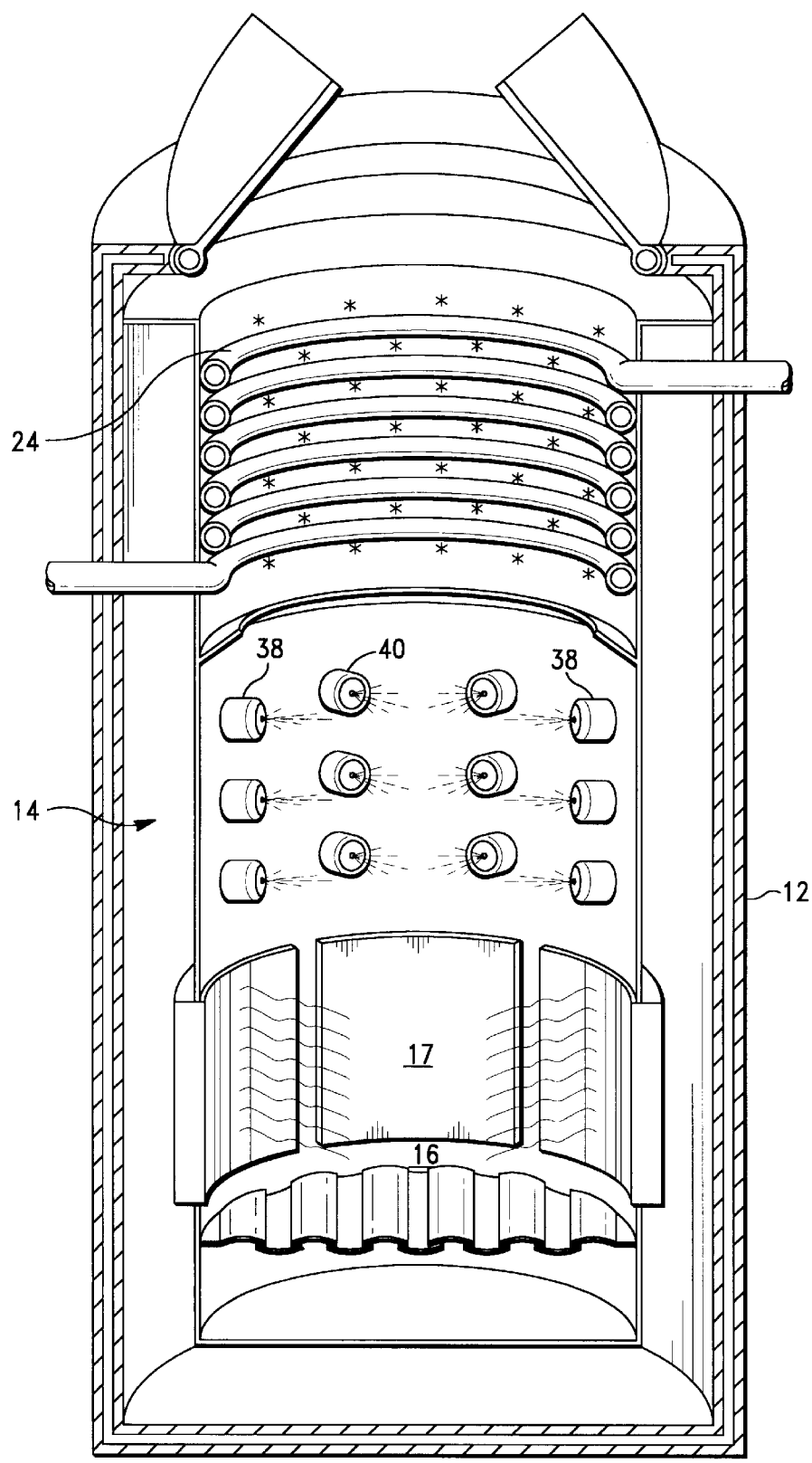
FIG. 2 is a detailed schematic representation of the process tank in accordance with the apparatus of this invention.

The drying apparatus and method in accordance with this invention processes solid articles, including, but not limited to semiconductor wafers. The drying apparatus and method removes aqueous solutions from solid articles without adding static or statically charged particulates or other contamination or stains. In one embodiment, the drying apparatus comprises a process tank and a drying fluid supply system. The process tank includes a spray member having multiple spray nozzles for spraying a non-flammable drying fluid onto the surfaces of the article. In one embodiment the drying apparatus is top loading and in another embodiment the drying apparatus is front loading.

In another embodiment, the drying fluid comprises a drying agent and a surfactant. The drying fluid is non-VOC material, which leaves no residual residue on surfaces of the article after being sprayed on the article for drying. In another embodiment, the drying agent comprises hydrofluoroether (HFE) and the surfactant comprises isopropyl alcohol (IPA). A compressed dry air supply, compressed nitrogen supply, or a gas may be used to force the drying fluid through the spray nozzles.

The drying fluid supply system provides the drying fluid to the spray nozzles using a supply line connected to a reservoir of drying fluid. In one exemplary embodiment, the drying fluid supply system is capable of adding more drying agent and/or more surfactant to the drying fluid via an in-situ spiking mechanism.

In another exemplary embodiment, the drying apparatus and method in accordance with this invention includes a separation tank and a waste tank. After spray drying a mixture is formed which includes the contaminants and aqueous products, the surfactant and the drying agent. Upon mixing the surfactant with water, the surfactant with the water is no longer soluble in the drying agent. As will be appreciated, this aids in separating the drying agent from the rest of the mixture.

The mixture including the drying agent is sent through a primary filter between the process tank and the waste and separation tanks after spray drying. The drying agent is sent to the separation tank, while the rest of the mixture is received as discharge by the waste tank. After separating drying agent from the rest of the mixture, i.e. the surfactant and other products, the drying agent in the separation is pumped through a series of filters to further purify the used drying agent. Upon a successful filtration process, the drying agent may be recirculated to the drying fluid supply system for use in subsequent drying operations.

The separation tank of this embodiment comprises a separation filter (e.g., an encapsulated perforated filter) that creates surface tension to facilitate separation of the mixture of the drying agent from the surfactant and from the water. It should be noted that the HFE and the IPA with aqueous products (after spray drying) do not mix so that separation is encouraged based upon the selection of those chemical materials in conjunction with a thorough understanding of the method of drying in accordance with this invention. Additionally, the density difference between the HFE and IPA with aqueous products causes the HFE to sink alone to the bottom of the separation tank and to be collected there for additional filtering. A pump pumps the separated HFE through a series of filters for cleaning any impurities and then back to the reservoir for re-use in the supply system drying agent.

The invention will now be described with respect to FIG. 1, which illustrates a preferred embodiment of the invention, an apparatus for drying solid articles shown generally by the numeral 10. The drying apparatus 10 includes a process tank 12 having a spray member 14 and a platform 16 upon which the articles are stationed for spraying. The process tank 12 includes at least one panel heater 17 for heating the ambient environment within the process tank 12.

The process tank 12 is made from stainless steel or electro-polished stainless steel. Typically, the process tank is sized for the application.

The drying apparatus 10 includes a condensation prevention system 18 for preventing the dried articles from forming condensation as it is moved from the process tank 16 to the ambient environment outside of the process tank 16. The condensation prevention system 18 includes a series of coils 24. The coils 24 are positioned so that after drying the articles, the articles must be pass through the coils 24.

The coils 24 contains a cooling fluid, preferably water, which is chilled by a device such as in-line chiller unit within the drying apparatus 10 for "in-house" chilling. The temperature of the cooling fluid may be adjusted to the temperature desired to prevent even small amounts of condensation from the articles upon being dried.

While not required in accordance with the apparatus and method of the invention, it is often desirable to heat the ambient air surrounding the articles to be dried before drying as well as heating drying fluid. This has the effect of breaking the surface tension of a wetted surface and allowing the drying fluid to penetrate all surfaces of the solid articles to be dried. However, this heating has the effect of raising the temperature of the articles. The temperature differential between the ambient environment and the article after such heating can be as much as 15 to 20 degrees Fahrenheit even using the apparatus and method in accordance with the invention herein. If not controlled, condensation will form on the dried articles causing particulates and contaminates to form on the dried articles. By passing the dried articles through the intermediate step of the condensation prevention system 18, condensation is virtually eliminated.

The drying apparatus 10 includes a separation tank 20 for collecting the drying fluid once it has been sprayed on the article(s) to be dried. The separation tank 20 includes a separation filter 22 for separating the HFE from the remainder of the drying fluid. The drying fluid is mixed with de-ionized water (DI water).

Upon initial separation by the separation filter 22, the IPA/DI water is funneled to a waste tank 26. The HFE is then pumped by a pump 28 through a series of HFE filters 30. Upon secondary filtration, the HFE can be saved or recycled into the drying fluid supply system.

The drying apparatus 10 additionally includes a drying fluid supply system generally denoted by the numeral 100. The drying fluid supply system 100 includes a reservoir 102 having a supply of drying fluid connected by a supply line 104 to the spray member 14. An in-line heating unit 106 in supply line 104 and between the reservoir 102 and the spray member 14 heats the drying fluid to the desired temperature. Additionally, in other preferred embodiments, an in-line heating unit may be excluded or simply turned off and the drying fluid may be used unheated.

The exemplary embodiment of the drying fluid supply system 100 includes a spiking system generally denoted by the numeral 110. The spiking system 110 includes spike canisters 112 and 114 for each of the drying agent and the surfactant, respectively. Connection lines link the canisters 112 and 114 with various regulators and the reservoir 102. Additionally, the system 100 includes a spiking regulator for regulating the spiking of both the IPA and HFE. A series of valves, such as air operated or solenoid operated valves or like valves control the dispensing of the drying fluid and surfactant into the reservoir 102.

The spray member 14 includes a series of spray valves 15 as illustrated in FIG. 1. The spray valves 15 are connected for a series of pressure regulators 19 which are in turn connected to a series of valves and which are in turn connected to supply line 104.

Drying Fluid Embodiments:

As noted above, the amount of IPA will greatly depend upon the mass of the articles inserted into the drying apparatus in a particular drying operation. In one embodiment, the mixture is 0.03% IPA and the remainder is HFE. In alternative embodiments, other mixtures in which IPA is within the range of 0.03% to 6.0% are used. Additionally, an isopropanol and hydrofluorocarbon (HFC)-based fluid, such as Vertrel X-P10, available from E. I du Pont de Nemours and Company, is used in other embodiments.

In Use:

In order to dry solid articles in accordance with the apparatus and method of the instant invention, the articles are inserted into the process tank 12 and fixing to the platform 16. Upon demand, the drying fluid is pressure forced from the reservoir 102 through the in-line heating unit 106 to one or more valves using a supply line 104. The in-line heating unit 106 heats the drying fluid before it is sprayed onto the articles.

After spraying the articles, the drying fluid together with any aqueous solution and contaminants, collects at the bottom of the process tank 12. At the bottom of the process tank 12, the collected fluid is removed through a drain 32. The collected fluid passes through a separation filter 34 and into the closed separation tank 20. The use of a closed separation tank 20 reduces evaporation of the carrier fluid in comparison to open tank separation vats in the prior art. The decrease in evaporation reduces environmental emissions associated with the process. Additionally, the decrease in evaporation allows more of the HFE to be collected which decreases the costs of the drying operation dramatically since HFE is highly expensive.

The separation filter 34 filter creates surface tension between IPA, the aqueous solutions and contaminants and the HFE causing the aqueous solutions to separate from the drying fluid. It will be noted as set forth above, that the IPA with aqueous solution (after spray drying) does not mix with the HFE. In one example, the separation filter 34 is made from a perforated material.

The process tank 12 includes connection to a waste tank 26 and a separation tank 20. The waste tank 26, which captures the overflow of IPA and other aqueous products (after spray drying). The IPA and other aqueous products may be further filtered through a series of filters (not shown) to filter out the contaminants and aqueous products in order to reuse the IPA. A separation filter 34 is advantageously placed between the process tank 12 and the waste tank 26.

The HFE is collected in the separation tank 20. The pump 28 forces the collected HFE through a series of HFE filters 30 for secondary filtration. These HFE filters 30 ready the HFE for recycling. Upon completion of the HFE secondary filtering process, the pump 28 pumps the filter the HFE back into the reservoir as desired.

The drying fluid supply system includes a concentration regulator for detecting and correcting spikes in the component concentrations of the drying fluid held in the reservoir 102. In order to correct any variations, the concentration regulator dispenses components of the drying fluid from the component canisters 1 12, 114 as desired into the reservoir 102. The concentration regulator is connected to a sample line, which extends into the drying fluid in the reservoir 102. As noted above concentrations of IPA higher than 6% can be used, but only when it does not cause the drying fluid to become flammable. As also noted above such flammability causes the drying fluid to go beyond preferred safety limitations.

Should the concentration of HFE to IPA become lower than a predetermined concentration, the regulator dispenses an appropriate amount of HFE from an HFE spike canister 112. If the concentration of HFE to IPA becomes higher than the predetermined concentration, the regulator dispenses an appropriate amount of IPA from an IPA spike canister 114. The regulator controls the dispensing of the components utilizing valves on lines extending from the spike canisters 112 and 114 to an inlet line into the reservoir 102.

In an alternative embodiment, the dryer does not include the reservoir 102 and the in-situ mixing of the HFE and IPA occurs using a supply line running between the HFE filters 30 and the in-line heating unit 106.

The valves control the dispensing of the drying fluid to the spray nozzles 15, which include in the preferred embodiment spray horns 36. The valves are independently pressure regulated and can be monitored by pressure regulators. The independent control of the valves allows each of the spray nozzles 15 to be adjusted for differing drying processes. For example, a first set of nozzles 15 may dispense a high pressure spray, a second set of nozzles 38 may dispense a moderate pressure spray, and a third set of spray nozzles 40 may dispense a mist or fog of drying fluid. After spraying, the process repeats as earlier described. In one embodiment, each set of spray nozzles 15, 38 and 40 is actuated as the article moves through the process tank 12.

The material in the waste compartment 26 may also be filtered and recycled or simply discarded without great concern. The minimal amounts of contaminants and like products in the solution do not present an abnormal environmental hazard in the manufacturing process. Thusly, the waste may be discarded without incurring great costs or difficult environmental procedures. Thusly, aqueous solutions and contaminants as well as the IPA collected in the waste compartment 26 are removed through a waste line.

Upon completion of the drying process, the dried articles are removed from the process tank. Where the articles were heated above ambient temperatures, it is preferred to pass the dried articles through the condensation prevention system 18 to prevent any possibility of the formation of condensation on the articles.

The cooling coils 24 are positioned above the spray nozzles 15 toward the top of the process tank 12 aid in collection by promoting condensation of the drying fluid spray. The cooling coils 24 are secured within the process tank 12 and are cooled from a chilled water source external to the process tank 12.

In one embodiment, the pressure at which the drying fluid is spray is controlled to prevent and even limit reduce electrostatic discharge (ESD) from 1 psi to 120 psi.

While the foregoing detailed description has described several embodiments of the apparatus and method of drying solid articles in accordance with this invention, it is to be understood that the above description is illustrative only and not limiting of the disclosed invention. Particularly, while semi-conductor wafers may have been discussed as the primary articles to be dried, the apparatus and method herein are not so limited. As noted above, the apparatus and method herein are primarily designed for solid articles. Additionally, while specific dimensions and mixtures have been disclosed, the invention herein is not so limited. It will be appreciated that the embodiments discussed above and the virtually infinite embodiments that are not described in detail are easily within the scope and spirit of this invention. Thus, the invention is to be limited only by the claims as set forth below.

What is claimed is:

1. An apparatus for drying solid articles, comprising:
   a process tank having a spray member;
   a platform member for holding an article to be dried in the tank;
   a spray member for applying, by spraying, a drying fluid including a drying agent in combination with a surfactant to the article to be dried; the drying agent comprising HFE and the surfactant including an alcohol based product; and
   a drying fluid supply system connected to the spray member for supplying drying fluid to the spray member,
   whereby article is dried by spraying of a drying agent in combination with a surfactant.

2. The drying apparatus as set forth in claim 1, wherein the drying fluid comprises a surfactant of an amount of IPA insufficient to make the drying fluid flammable and the remainder the drying agent of HFE.

3. The drying apparatus as set forth in claim 1, wherein the drying fluid comprises between 0.01% and 15% IPA and the remainder HFE.

4. The drying apparatus as set forth in claim 1, wherein the drying apparatus includes a system for recovering the HFE.

5. The drying apparatus as set forth in claim 4, wherein the drying apparatus includes a recycling system for recycling the HFE in the drying apparatus.

6. The drying apparatus as set forth in claim 1, wherein the drying apparatus includes a system for recovering the IPA.

7. The drying apparatus as set forth in claim 6, wherein the drying apparatus includes a recycling system for recycling the IPA in the drying apparatus.

8. The drying apparatus as set forth in claim 1, wherein the drying apparatus includes a spiking system for spiking the drying apparatus with IPA.

9. The drying apparatus as set forth in claim 1, wherein the drying apparatus includes a spiking system for spiking the drying apparatus with HFE.

10. The drying apparatus as set forth in claim 1, wherein the drying apparatus includes a condensation prevention system.

11. The drying apparatus as set forth in claim 10, wherein the drying apparatus includes a condensation prevention system comprising a system of cooling coils being filled with a cooling liquid.

12. The drying apparatus as set forth in claim 1, wherein the drying apparatus includes a reservoir of drying agent, a supply line between the spray members and the reservoir and in line heating unit between the spray members and the reservoir.

13. The drying apparatus as set forth in claim 1, wherein the drying apparatus includes a separation tank for separating the drying agent and the surfactant, the separation tank including a separation filter for creating surface tension to facilitate separation of the mixture of the drying agent and the surfactant from the water.

14. The drying apparatus as set forth in claim 13, wherein the separation filter system includes a perforated filter.

15. The drying apparatus as set forth in claim 13, wherein the separation filter system comprises:
   a perforated filter, a pump coupled to the separation tank for pumping the drying fluid from the separation tank to the drying fluid supply system; and
   one or more filters coupled between the pump and the drying fluid supply system to filter the drying fluid pumped from the separation tank to the drying fluid supply system.

16. The drying apparatus as set forth in claim 1, wherein the spray member includes a plurality of spray nozzles.

17. The drying apparatus as set forth in claim 16, wherein the drying apparatus includes a compressed dry air supply system coupled to the plurality of spray nozzles for forcing the drying fluid through the plurality of nozzles.

18. The drying apparatus as set forth in claim 1, wherein the process tank includes at least one wall panel heater for heating the ambient fluid of the process tank.

19. A method of drying solid articles including the steps of
   fixing the articles to be dried in a process tank;
   applying a drying fluid by spraying to the articles in the process tank, wherein the drying fluid including a drying agent of HFE and a surfactant of an alcohol based product, such that the drying fluid is not flammable;
   extracting the drying fluid from the tank; and
   separating the drying agent from the extracted drying fluid.

20. The method as set forth in claim 19, wherein the step of recycling the drying agent from the extracted drying fluid for the reuse is included.

21. The method as set forth in claim 19, wherein the step of heating the drying agent prior to spraying is included.

22. The method as set forth in claim 19, wherein the surfactant comprises IPA.

23. The method as set forth in claim 19, wherein the surfactant comprises between 0.01% and 15% of the drying fluid and the remainder being the drying agent.

24. The method as set forth in claim 19, wherein the drying fluid is non-flammable.

25. The method as set forth in claim 19, wherein the following steps are included:

providing the process tank with at least one panel heater;

heating the process tank during spraying of the drying fluid;

providing the process tank with a condensation prevention system;

after spraying, passing the article to be dried through the condensation prevention system.

* * * * *